United States Patent
Chien (10) Patent No.: US 10,725,357 B2
(45) Date of Patent: Jul. 28, 2020

(54) DISPLAY PANEL, METHOD FOR MANUFACTURING THE DISPLAY PANEL AND DISPLAY APPARATUS

(71) Applicant: HKC Corporation Limited, Shenzhen (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 15/744,792

(22) PCT Filed: May 12, 2017

(86) PCT No.: PCT/CN2017/084118
§ 371 (c)(1),
(2) Date: Jan. 13, 2018

(87) PCT Pub. No.: WO2018/171022
PCT Pub. Date: Sep. 27, 2018

(65) Prior Publication Data
US 2019/0011741 A1 Jan. 10, 2019

(30) Foreign Application Priority Data
Mar. 21, 2017 (CN) .......................... 2017 1 01689049

(51) Int. Cl.
*G02F 1/1368* (2006.01)
*G02F 1/1333* (2006.01)
(Continued)

(52) U.S. Cl.
CPC ...... *G02F 1/1368* (2013.01); *G02F 1/133345* (2013.01); *G02F 1/133514* (2013.01);
(Continued)

(58) Field of Classification Search
CPC ............................................... G02F 1/133514
(Continued)

(56) References Cited

U.S. PATENT DOCUMENTS 7,268,842 B2 * 9/2007 Sawasaki .......... G02F 1/136227
349/106
9,466,485 B2 10/2016 Torii
(Continued)

FOREIGN PATENT DOCUMENTS

| CN | 102654705 A | 9/2012 |
| CN | 103579283 A | 2/2014 |

(Continued)

OTHER PUBLICATIONS

Xin Sun, The International Searching Authority written comments, Dec. 2017, CN.

*Primary Examiner* — David Vu
*Assistant Examiner* — Brandon C Fox (57) ABSTRACT

The present disclosure provides a display panel, including a substrate and an active switches disposed on the substrate. A composite photoresist layer having dielectric properties is covered on the active switches, to reduce manufacturing procedures of the display panel.

14 Claims, 7 Drawing Sheets

(51) Int. Cl.
*G02F 1/1335* (2006.01)
*H01L 27/12* (2006.01)
*G02F 1/1362* (2006.01)

(52) U.S. Cl.
CPC ...... *H01L 27/1248* (2013.01); *H01L 27/1288* (2013.01); *G02F 2001/136222* (2013.01)

(58) Field of Classification Search
USPC .............................................. 349/47; 257/72
See application file for complete search history.

(56) References Cited

U.S. PATENT DOCUMENTS

| | | | | |
|---|---|---|---|---|
| 2005/0078256 | A1* | 4/2005 | Hong | G02F 1/134363 349/141 |
| 2009/0302312 | A1* | 12/2009 | Suh | H01L 27/3274 257/40 |
| 2012/0241746 | A1* | 9/2012 | Xie | H01L 27/1248 257/59 |
| 2012/0289006 | A1* | 11/2012 | Yuan | H01L 27/1288 438/158 |
| 2017/0090232 | A1* | 3/2017 | Tang | G02F 1/133512 |

FOREIGN PATENT DOCUMENTS

| | | | |
|---|---|---|---|
| CN | 103985736 | A | 8/2014 |
| CN | 104538428 | A | 4/2015 |
| CN | 105467670 | A | 4/2016 |
| CN | 105552027 | A | 5/2016 |

\* cited by examiner

FIG. 12

DISPLAY PANEL, METHOD FOR MANUFACTURING THE DISPLAY PANEL AND DISPLAY APPARATUS

TECHNICAL FIELD

The present disclosure relates to the field of displays, and more particularly to a display panel, a method for manufacturing the display panel, and a display apparatus.

BACKGROUND

Display apparatuses have numerous advantages, such as a thin body, power saving, no radiation, etc., and are widely used. Most display apparatuses in the current market are backlit display apparatuses, each including a display panel and a backlight module. Operating principle of the display panel is that liquid crystals are positioned between two substrates paralleled each other, and a driving voltage is applied to two substrates to control orientation of the liquid crystals, further reflecting light of the backlight module and generating images.

The thin film transistor liquid crystal display (TFT-LCD) apparatuses currently maintain a leading status in the display field because of low power consumption, excellent picture quality, and high production yield, and other properties. Similarly, the TFT-LCD apparatus includes a display panel and a backlight module. The display panel includes a color filter (CF) substrate and a thin film transistor (TFT) substrate, and transparent electrodes on relative inner sides of the above substrates. A layer of liquid crystals (LC) is positioned between the two substrates. The display panel changes the polarized state of light by controlling direction of the liquid crystals through an electric field, for penetration and obstruction of a light path via a polarized plate to display.

In a current display panel industry, a protective layer is formed by Chemical Vapor Deposition (CVD) before manufacturing a color filter layer, further protecting finished structure on the display panel to make steps for manufacturing the display panel complicated, and further increase manufacturing cost of the display panel.

SUMMARY

A technical problem to be solved by the present disclosure is to provide a display panel, to reduce manufacturing procedures of the display panel.

The present disclosure further provides a method for manufacturing the display panel.

The aim of the present disclosure is achieved through the following technical solution.

A display panel comprises:
a substrate; and
active switches disposed on the substrate;
a composite photoresist layer having dielectric properties is covered on the active switches.

The composite photoresist layer is made of composite photoresist comprising at least one passivation layer and at least one color layer. The composite photoresist having a multi-layers structure is formed by stacking at least one passivation layer and at least one color layer. Therefore, the composite photoresist has the dielectric properties required by material of the protective layer and has RGB colors of the color photoresist, the composite photoresist can apply to the display panel, is effective to replace material of the protective layer and material of the color filter layer, further simplifying the manufacturing processes of the display panel, reducing production time of the display panel, improving production efficiency of the display panel, reducing production cost of the display panel, and improving the market competitiveness of the display panel.

Furthermore, the passivation layer and the color layer both have one layer, and the passivation layer and the color layer are stacked. The passivation layer and the color layer both have one layer. The passivation layer has the dielectric properties required by material of the protective layer and the color layer has RGB colors of the color photoresist. Different single color (red/green/blue) is generated by arranging the color layer. The passivation layer and the color layer are stacked, and the color layer is disposed on the passivation layer, further simplifying manufacturing processes of the display panel, reducing steps of the process for manufacturing the display panel, reducing production time of the display panel, and improving production efficiency of the display panel.

Furthermore, the passivation layer has two layers and the color layer has one layer, and the color layer is positioned between two passivation layers to stack the passivation layers and the color layer. The composite photoresist is covered on the active switches, further forming the composite photoresist layer by simple yellow light process. The color layer is positioned between two passivation layers to protect the color layer, further avoiding organic material of the color layer from releasing some harmful impurity gas in the subsequent process to protect the display panel and increase efficiency and life-time of the display panel.

According to another aspect of the present disclosure, the present disclosure provides a method for manufacturing the display panel, where the display panel comprises a substrate and active switches disposed on the substrate, the method comprises:

S11: covering a composite photoresist layer on the active switches; and
S12: obtaining the composite photoresist layer covered on the active switches using a mask process.

Based on the above method, the composite photoresist layer of the display panel is formed using the mask process. The composite photoresist layer is effective to replace the protective layer and RGB colored photoresist layer, and the composite photoresist having dielectric properties is covered on the active switches, further simplifying the process for manufacturing the display panel, reducing steps of the process for manufacturing the display panel, reducing production time of the display panel, and improving the production efficiency of the display panel.

Furthermore, the composite photoresist comprises the passivation layer and the color layer, the step for obtaining the composite photoresist comprises:

S21: adding passivation material to a lower layer of high polymer material;
S22: adding color material to an upper layer of the high polymer material; and
S23: obtaining the composite photoresist having double-layer structure using a photo-curing process and a thermal reaction process.

The passivation material is added to the lower layer of the high polymer material, and the color material is added to the upper layer of the high polymer material. Double-layer polymer structure and added material generate chemical reaction using the photo-curing process and the thermal reaction process. RGB color layer depends on the color material. The lower layer of the high polymer material adding the passivation material after passivation becomes a non-conductive layer having insulating function. The upper layer of the high polymer material adding the color material becomes a RGB color layer, further obtaining the composite photoresist having the double-layer structure, simplifying the process, largely manufacturing the composite photoresist, and reducing production time.

Furthermore, the composite photoresist 31 comprises two passivation layers and one color layer, the step for obtaining the composite photoresist comprises:

S31: adding passivation material to the lower layer of the high polymer material;
S32: adding color material to a middle layer of the high polymer material;
S33: adding the passivation material to the upper layer of the high polymer material; and
S34: obtaining the composite photoresist having three-layers structure using a photo-curing process and a thermal reaction process The passivation material is added to the lower layer and the upper layer of the high polymer material, and the color material is added to the middle layer of the high polymer material. The three-layers polymer structure and added material generate chemical reaction using the photo-curing process and the thermal reaction process. RGB color layer depends on the color material, further simplifying the process, largely manufacturing the composite photoresist, and reducing production time.

Furthermore, the step for obtaining the composite photoresist 31 comprises:

adding mixture of the passivation material and the color material to the high polymer material; and
obtaining the composite photoresist having one-layer structure using the photo-curing process and the thermal reaction process.

The mixture of the passivation material and the color material is added to the high polymer material. The one-layer polymer structure and added material generate chemical reaction using the photo-curing process and the thermal reaction process. RGB color layer depends on the color material. Thus, the composite photoresist having one-layer structure is obtained.

Furthermore, the step for obtaining the composite photoresist layer covered on the active switches using a mask process comprises:

arranging photosensitive material on the composite photoresist layer;
obtaining pattern of the composite photoresist layer using a mask process;
obtaining the composite photoresist layer using etching with an etching solution; and removing a remaining photosensitive material.

The photosensitive material is disposed on the composite photoresist, and the photosensitive material is subjected to exposure development by the mask process to obtain the pattern of the composite photoresist layer. The composite photoresist is etched using the etching solution to obtain the composite photoresist layer, and residual composite photoresist on the composite photoresist layer is removed using cleaning fluid to be convenient to operate in the subsequent process and operate other process on the composite photoresist layer, further conveniently manufacturing the display panel.

According to another aspect of the present disclosure, the present disclosure provides a display apparatus, where the display apparatus comprises the above display panel.

In the present disclosure, the composite photoresist has good dielectric properties, further replacing the protective layer generated by chemical vapor deposition (CVD) sputtering SiNx in color filter on array process, reducing steps of the process for manufacturing the display panel, conveniently manufacturing the display panel, simplifying the process for manufacturing the display panel, reducing production time of the display panel, and improving production efficiency of the display panel. The process for generating protective layer using chemical vapor deposition (CVD) to sputter SiNx is removed, to reduce production cost of the display panel and improve market competitiveness of the display panel. In addition, the composite photoresist layer has RGB color and replaces the color filter layer. The composite photoresist layer is easy to use without using the CVD process/a etching process, only needs to simple yellow light process and replaces the protective layer and RGB colored photoresist layer, which is easy to arrange the composite photoresist layer, simplify the process for manufacturing the display panel, and improve production efficiency of the display panel.

BRIEF DESCRIPTION OF FIGURES

The drawings included are used for providing further understanding of embodiments of the present application, constitute part of the description, and are used for illustrating implementation manners of the present application, and interpreting principles of the present application together with text description. Apparently, the drawings in the following description are merely some embodiments of the present application, and for those ordinary skilled in the art, other drawings can also be obtained according to the drawings without contributing creative labor. In the drawings.

Where 1. substrate, 2. active switches, 21. source electrodes, 22. drain electrodes, 3. composite photoresist layer, 31. composite photoresist, 32. passivation layer, 321. passivation material, 33. color layer, 331. color material, 4. high polymer material, 5. color filter layer, 6. protective layer, 7. Opening.

DETAILED DESCRIPTION

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated device or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly comprise one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation," "bonded," and "bonding" shall be understood in broad sense, and for example, may refer to fixed bonding or detachable bonding or integral bonding; may refer to mechanical bonding or electrical bonding; and may refer to direct bonding or indirect bonding through an intermediate medium or inner communication of two elements. For those of ordinary skill in the art, the meanings of the above terms in the present application may be understood according to concrete conditions.

The terms used herein are intended to merely describe concrete embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The present application will be further described in detail below in combination with the drawings and preferred embodiments.

Figure 1:
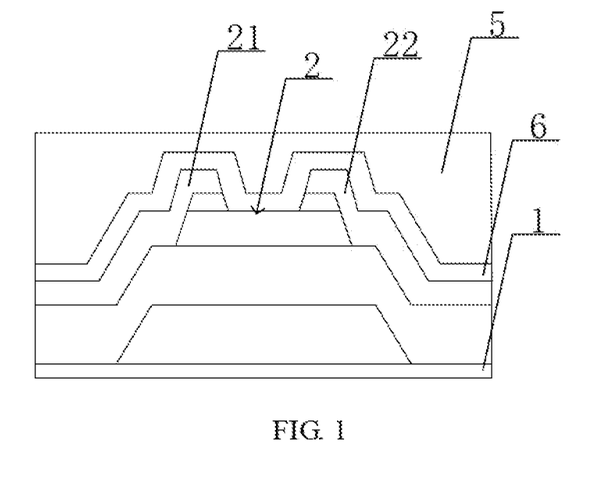
FIG. 1 is a cross-section schematic diagram of a display panel designed by inventors according to an embodiment of the present disclosure.

As shown in FIG. 1, inventors design a display panel that is unpublicized, where the display panel comprises a substrate 1, active switches 2 and a color filter layer 5. The active switches 2 is disposed on the substrate 1, a protective layer 6 is positioned between the active switches 2 and the color filter layer 5, and the protective layer 6 is covered on the active switches 2. The protective layer 6 is effective to avoid that detergent directly etches a metal layer of the active switches 2 of the display panel, which protects the metal layer of the active switches 2, further avoiding broken-line problem, improving yield of the display panel, and decreasing scrap cost. A side of the metal layer of the active switches 2 has a metallic burr from microstructure, and the protective layer 6 is better to cover the metallic burr of the metal layer of the active switches 2, which avoids the metallic burr being exposed to the protective layer 6. Thus, the protective layer 6 is effective to protect the metal layer of the active switches 2, further improving display of the display panel and competitiveness of the display panel.

The inventors further searched and found that: in a conventional manufacturing process, the protective layer 6 is effective to avoid developing liquid (KOH liquid) in process for manufacturing a pattern of the color filter layer 5 from damaging the metal layer of the active switches 2. However, the protective layer 6 is generated by chemical vapor deposition (CVD) process, which is complex and needs to high cost. Thus, the inventors provide a new technical scheme to reduce steps of the process for manufacturing the display panel.

The present application will be further described in detail below in combination with FIG. 2 to FIG. 4 and preferred embodiments.

The display panel comprises a substrate 1 and active switches 2. The active switches 2 are disposed on the substrate 1, and a composite photoresist layer 3 having dielectric properties is covered on the active switches 2.

As the composite photoresist layer 3 has dielectric properties, the composite photoresist layer 3 replaces the protective layer 6 generated by chemical vapor deposition (CVD) sputtering SiNx in color filter on array process, reduces steps of the process for manufacturing the display panel, conveniently manufactures the display panel, simplifies the process for manufacturing the display panel, reduces production time of the display panel, and improves production efficiency of the display panel. The process for generating protective layer 6 using chemical vapor deposition (CVD) to sputter SiNx is removed, to reduce production cost of the display panel and improve market competitiveness of the display panel. In addition, the composite photoresist layer 3 has RGB color and replaces the color filter layer 5. The composite photoresist layer 3 is easy to use without using the CVD process/a etching process, only needs to simple yellow light process and replaces the protective layer 6 and RGB colored photoresist layer, which is easy to arrange the composite photoresist layer 3, simplifies the process for manufacturing the display panel and improves production efficiency of the display panel.

The active switches 2 comprises gate electrodes disposed on the substrate, a semiconductor layer disposed on the gate electrodes, and source electrodes 21 and drain electrodes 22 disposed on the semiconductor layer.

The composite photoresist layer is made of composite photoresist 31, where the composite photoresist 31 comprises at least one passivation layer 32 and at least one color layer 33. The composite photoresist having a multi-layers structure is formed by stacking at least one passivation layer 32 and at least one color layer 33. Thus, the composite photoresist has the dielectric properties required by material of the protective layer 6 and has RGB colors of the color photoresist, the composite photoresist 31 can apply to the display panel, is effective to replace material of the protective layer and material of the color filter layer and is covered on the active switches 2, further forming the composite photoresist layer 3 by simple yellow light process, simplifying the process for manufacturing the display panel, reducing production time of the display panel, and improving the market competitiveness of the display panel.

Figure 2:
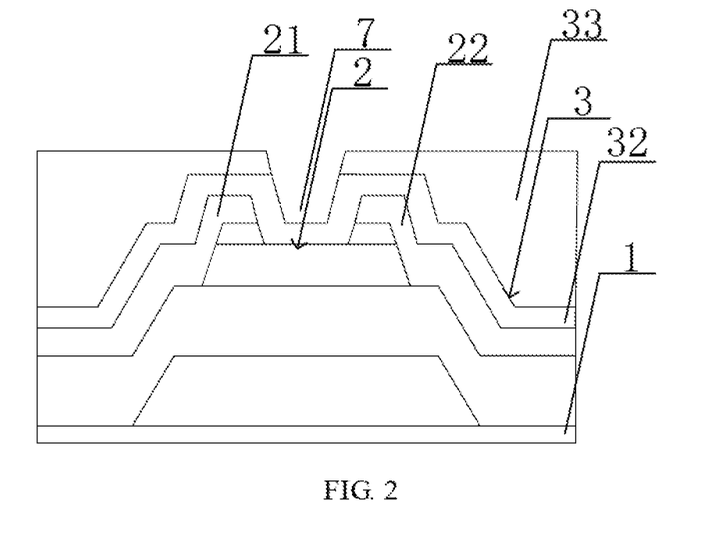
FIG. 2 is a cross-section schematic diagram of the display panel according to another embodiment of the present disclosure.

As shown in FIG. 2, the passivation layer 32 and the color layer 33 both have one layer, and the passivation layer 32 and the color layer 33 are stacked. The passivation layer 32 has the dielectric properties required by material of the protective layer 6 and the color layer 33 has RGB colors of the color photoresist. Different single color (red/green/blue) is generated by arranging the color layer 33. The passivation layer 32 and the color layer 33 are stacked, and the color layer 33 is disposed above the passivation layer 32. The composite photoresist 31 is covered on the active switches 2, further forming the composite photoresist layer 3 by simple yellow light process, simplifying the process for manufacturing the display panel, reducing production time of the display panel, and improving the market competitiveness of the display panel. The passivation layer 32 effectively protects the active switches 2, avoids that the detergent directly etches source electrodes 21 and drain electrodes 22 of the active switches 2 of the display panel, and protects the source electrodes 21 and the drain electrodes 22, further avoiding broken-line problem, decreasing scrap cost, and improving quality of the display panel. The source electrodes 21 and the drain electrodes 22 of the active switches 2 are made of metal material. Sides of the source electrodes 21 and the drain electrodes 22 of the active switches 2 have a metallic burr from microstructure, and the passivation layer 32 is better to protect the source electrodes 21 and the drain electrodes 22, effectively avoids the source electrodes 21 and the drain electrodes 22 from affecting in a subsequent process, and improves yield of the display panel.

Figure 3:
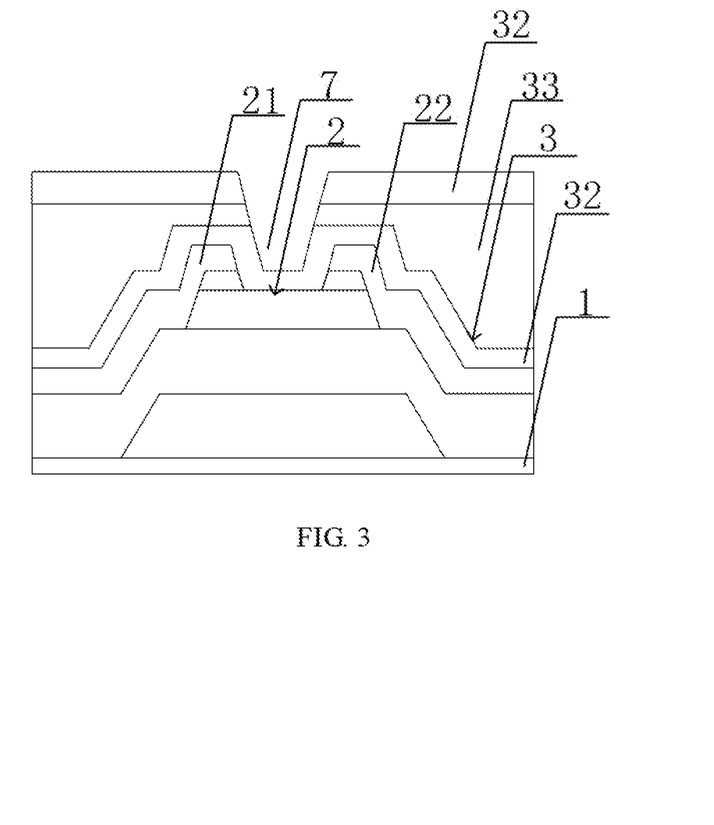
FIG. 3 is a cross-section schematic diagram of the display panel according to another embodiment of the present disclosure.

As shown in FIG. 3, the passivation layer 32 has two layers and the color layer 33 has one layer, and the color layer 33 is positioned between two passivation layers 32 to stack the passivation layers and the color layer. The composite photoresist 31 is covered on the active switches 2, further forming the composite photoresist layer 3 by simple yellow light process. The color layer 33 is positioned between two passivation layers 32 to protect the color layer 33, further avoiding organic material of the color layer 22 from releasing some harmful impurity gas in the subsequent process to protect the display panel and increase efficiency and life-time of the display panel. The composite photoresist 31 is covered on the active switches 2, further forming the composite photoresist layer 3 by simple yellow light process and replacing the protective layer 6 and RGB colored photoresist layer. Thus, it is easy to simplify the process for manufacturing the display panel, reduce the production time of the display panel and improve production efficiency of the display panel. The passivation layer 32 is effective to protect the active switches 2, and avoids that the detergent directly etches the source electrodes 21 and the drain electrodes 22 of the active switches 2 of the display panel in the subsequent process, and protects the source electrodes 21 and the drain electrodes 22, further avoiding broken-line problem, decreasing scrap cost, and improving quality of the display panel. The composite photoresist layer 3 comprises an opening 7 at a relative position of the source electrodes 21 and the grain electrodes 22.

Figure 4:
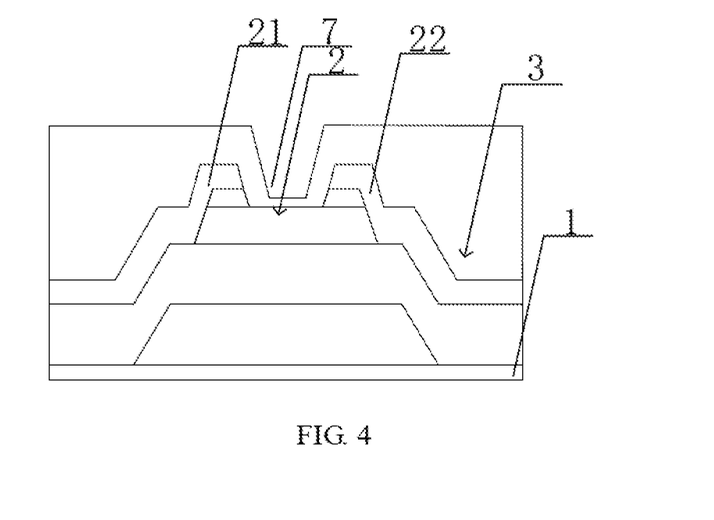
FIG. 4 is a cross-section schematic diagram of the display panel according to another embodiment of the present disclosure.

As shown in FIG. 4, the composite photoresist 31 is composed of a mixture of the passivation material and the color material, further forming the composite photoresist layer 3 by the simple yellow light process. The composite photoresist layer 3 replaces the protective layer 6 generated by chemical vapor deposition (CVD) sputtering SiNx in color filter on array process, reduces steps of the process for manufacturing the display panel, conveniently manufactures the display panel, simplifies the process for manufacturing the display panel, reduces production time of the display panel, and improves production efficiency of the display panel. The process for generating protective layer 6 using chemical vapor deposition (CVD) to sputter SiNx is removed, which reduces production cost of the display panel and improved market competitiveness of the display panel.

Figure 5:
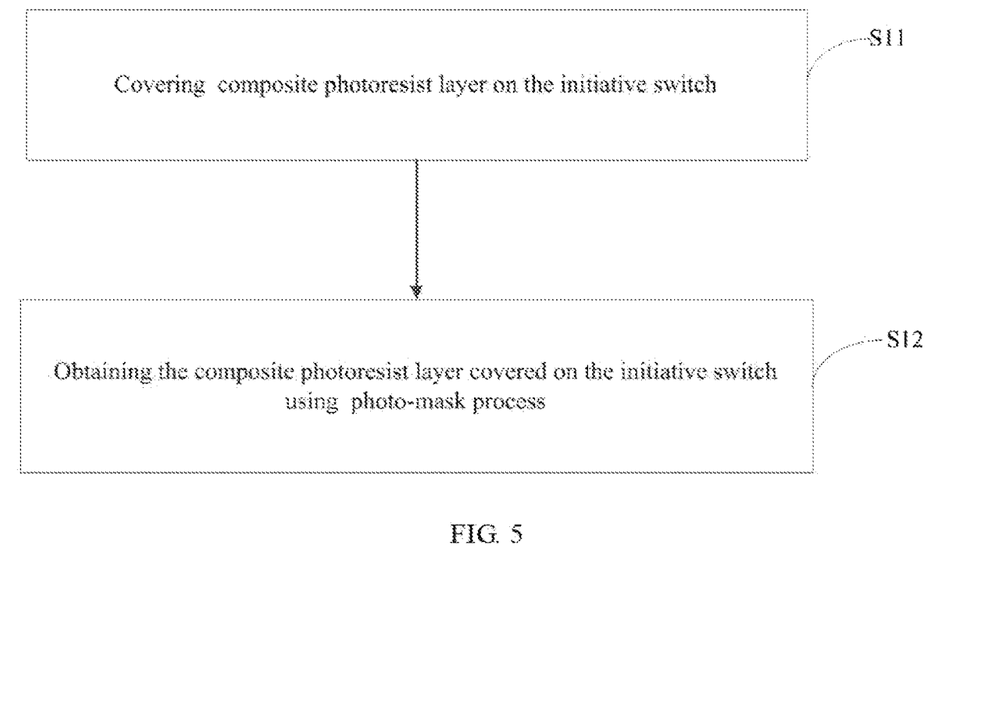
FIG. 5 is a flowchart of a method for manufacturing the display panel according to an embodiment of the present disclosure.

According to another aspect of the present disclosure, as shown in FIG. 5, the present disclosure provides a method for manufacturing the display panel, where the display panel comprises a substrate and an active switches disposed on the substrate, the method comprises:

S11: covering a composite photoresist layer on the active switches; and

S12: obtaining the composite photoresist layer covered on the active switches using a mask process.

Based on the above method, the composite photoresist layer 3 of the display panel is formed using the mask process. The composite photoresist layer 3 is effective to replace the protective layer 6 and RGB colored photoresist layer, and the composite photoresist 31 having dielectric properties is covered on the active switches 2, further simplifying the process for manufacturing the display panel, reducing steps of the process for manufacturing the display panel, reducing production time of the display panel, and improving the production efficiency of the display panel. As the composite photoresist layer 3 has good dielectric properties, the composite photoresist layer 3 replaces the protective layer 6 generated by chemical vapor deposition (CVD) sputtering SiNx in color filter on array process, reduces steps of the process for manufacturing the display panel, conveniently manufactures the display panel, simplifies the process for manufacturing the display panel, reduces the production time of the display panel, and improves production efficiency of the display panel. The process for generating protective layer 6 using chemical vapor deposition (CVD) to sputter SiNx is removed, which reduces production cost of the display panel and improved market competitiveness of the display panel. In addition, the composite photoresist layer 3 has RGB color and replaces the color filter layer 5. The composite photoresist layer 3 is easy to use without using the CVD process/a etching process, only needs to simple yellow light process and replaces the protective layer 6 and RGB colored photoresist layer, which is easy to arrange the composite photoresist layer 3, simplifies the process for manufacturing the display panel, improves production efficiency of the display panel, reduces production cost of the display panel and improved market competitiveness of the display panel.

Figure 6:
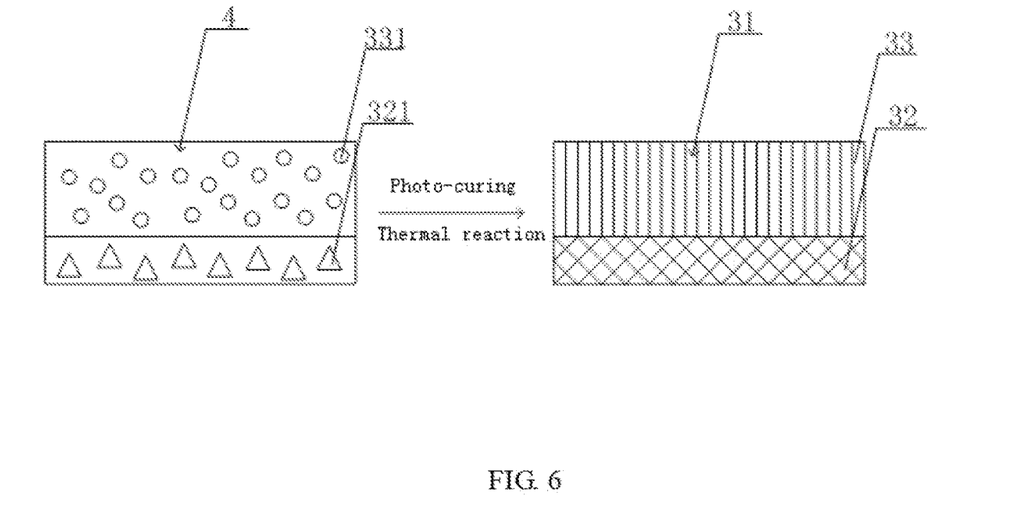
FIG. 6 is a schematic diagram of a method for manufacturing composite photoresist having double-layers structure according to an embodiment of the present disclosure.
Figure 7:
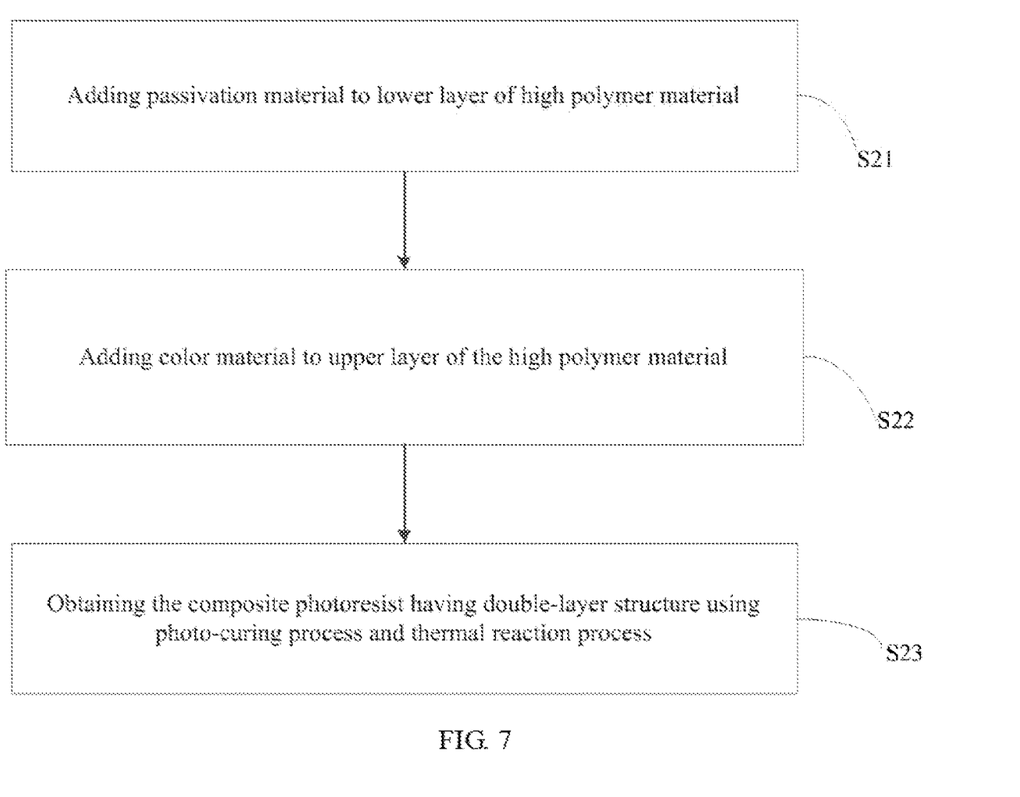
FIG. 7 is a flowchart of the method for manufacturing composite photoresist having double-layers structure according to the embodiment of the present disclosure.

As shown in FIG. 6 and FIG. 7, the composite photoresist 31 comprises the passivation layer 32 and the color layer 33, the step for obtaining the composite photoresist 31 comprises:

S21: adding passivation material to a lower layer of high polymer material;

S22: adding color material to an upper layer of the high polymer material; and

S23: obtaining the composite photoresist having double-layer structure using a photo-curing process and a thermal reaction process.

The high polymer material is any one of polymethyl methacrylate (PMMA), polystyrene (PS), polyethylene terephthalate (PET), polycarbonate (PC), polyacrylate (PAR) or transparent epoxy. The passivation material 321 is added to the lower layer of the high polymer material 4, and the color material 331 is added to the upper layer of the high polymer material. The passivation material 321 is any one of transparent resin, $SiO_2$ or SiNx, and the color material 331 is any one of red, green, blue, yellow, and yellow color material. The red color material is selected from one or more of perylene, quinacridone and pyrrolopyrrole, the yellow color material is selected from one or more of azo, azo condensed and heterocyclic, the green color material is selected from one or more of a bisazo condensation type, a metal complex and a phthalocyanine class. The blue color material is selected from hydroxyl-hydroquinones and/or indigo class. Double-layer polymer structure and added material generate chemical reaction using the photo-curing process and the thermal reaction process. RGB color layer depends on the color material 331. The lower layer of the high polymer material 4 adding the passivation material 321 after passivation becomes a non-conductive layer having insulating function. The upper layer of the high polymer material 4 adding the color material 331 becomes a RGB color layer, further obtaining the composite photoresist having double-layer structure, simplifying the process, largely manufacturing the composite photoresist 31, and reducing production time. The composite photoresist 31 is covered on the active switches 2, and the composite photoresist 31 is provided for two etching processes. The passivation layer 32 or the color layer 33 is etched by reaction selectivity of etching solution, respectively, further forming the composite photoresist layer 3. The passivation layer 32 is effective to protect the active switches 2, avoid that the detergent directly etches the source electrodes 21 and the drain electrodes 22 of the active switches 2 of the display panel in the subsequent process, and protect the source electrodes 21 and the drain electrodes 22, further avoiding broken-line problem, decreasing scrap cost, and improving quality of the display panel. The source electrodes 21 and the drain electrodes 22 of the active switches 2 are made of metal material. Sides of the source electrodes 21 and the drain electrodes 22 of the active switches 2 have a metallic burr from microstructure, and the passivation layer 32 is better to protect the source electrodes 21 and the drain electrodes 22, effectively avoids the source electrodes 21 and the drain electrodes 22 from affecting in a subsequent process, and improves yield of the display panel.

Figure 8:
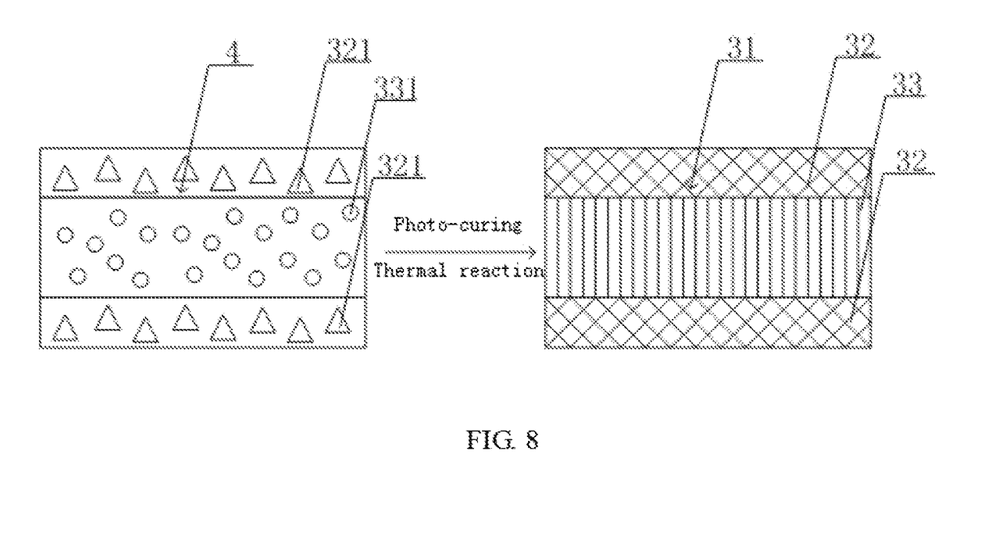
FIG. 8 is a schematic diagram of a method for manufacturing composite photoresist having three-layers structure according to an embodiment of the present disclosure.
Figure 9:
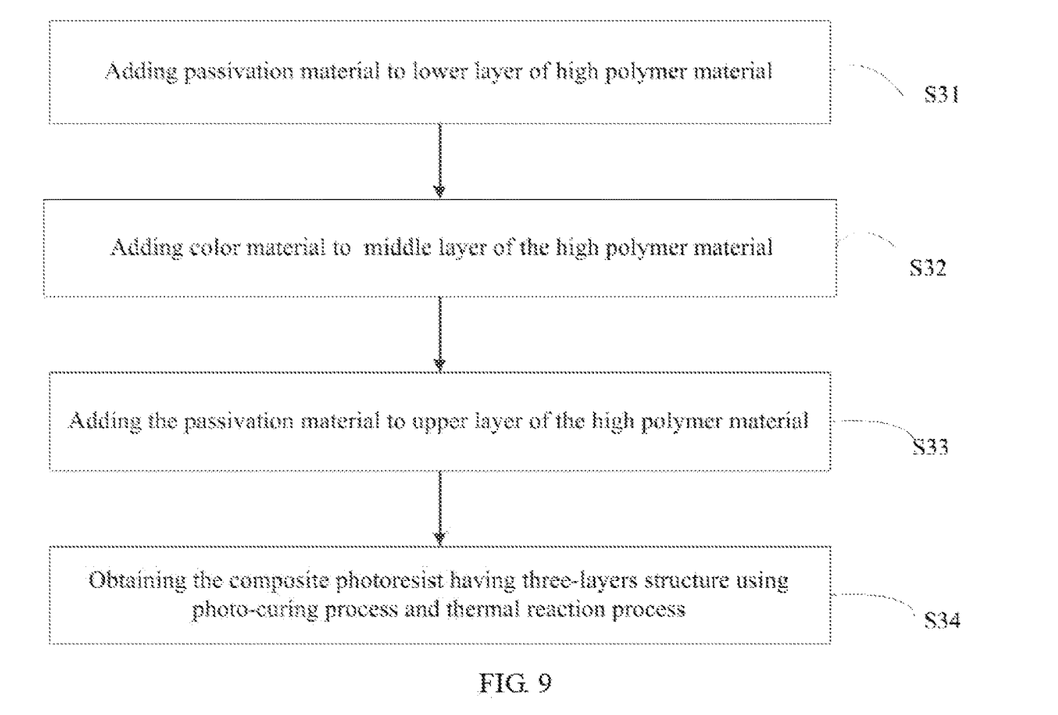
FIG. 9 is a flowchart of the method for manufacturing composite photoresist having three-layers structure according to an embodiment of the present disclosure.

As shown in FIG. 8 and FIG. 9, the composite photoresist 31 comprises two passivation layers and one color layer, the step for obtaining the composite photoresist comprises:
S31: adding passivation material to a lower layer of the high polymer material;
S32: adding color material to a middle layer of the high polymer material;
S33: adding the passivation material to an upper layer of the high polymer material; and
S34: obtaining the composite photoresist having three-layers structure using a photo-curing process and a thermal reaction process.

The passivation material 321 is added to the lower layer and the upper layer of the high polymer material 4, and the color material 331 is added to the middle layer of the high polymer material 4. The three-layers polymer structure and added material generate chemical reaction using the photo-curing process and the thermal reaction process. RGB color layer depends on the color material 331. The lower layer and the upper layer of the high polymer material 4 adding the passivation material 321 after passivation becomes a non-conductive layer having insulating function. The middle layer of the high polymer material 4 adding the color material 331 becomes a RGB color layer, further obtaining the composite photoresist having three-layers structure, simplifying the process, largely manufacturing the composite photoresist 31, and reducing production time. The composite photoresist 31 is covered on the active switches 2, and the composite photoresist 31 is provided for three etching processes. The passivation layer 32 or the color layer 33 is etched by reaction selectivity of etching solution, respectively, further forming the composite photoresist layer 3. The color layer 33 is positioned between the two passivation layer 32 to protect the color layer 33, further avoiding organic material of the color layer 32 from releasing some harmful impurity gas in the subsequent process to protect the display panel and increase efficiency and life-time of the display panel. At the same time, the passivation layer 32 is effective to protect the active switches 2, avoid that the detergent directly etches the source electrodes 21 and the drain electrodes 22 of the active switches 2 of the display panel in the subsequent process, and protect the source electrodes 21 and the drain electrodes 22, further avoiding broken-line problem, decreasing scrap cost, and improving quality of the display panel.

Figure 10:
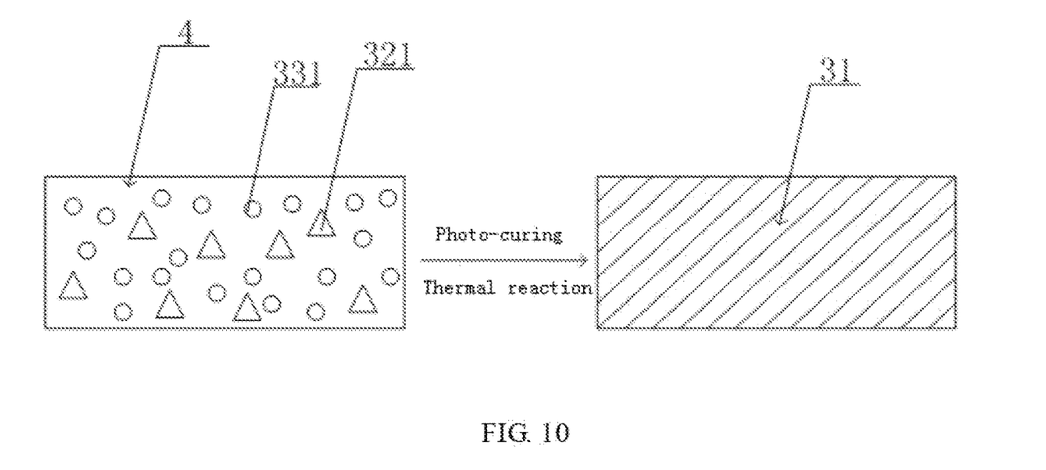
FIG. 10 is a schematic diagram of a method for manufacturing composite photoresist having one-layer structure according to an embodiment of the present disclosure.
Figure 11:
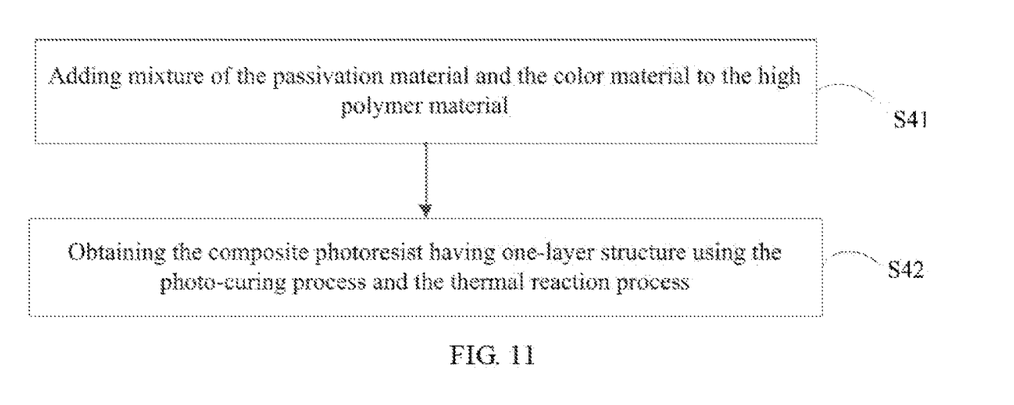
FIG. 11 is a flowchart of the method for manufacturing composite photoresist having one-layer structure according to an embodiment of the present disclosure.

As shown in FIG. 10 and FIG. 11, the step for obtaining the composite photoresist 31 comprises:
S41: adding mixture of the passivation material and the color material to the high polymer material; and
S42: obtaining the composite photoresist having one-layer structure using the photo-curing process and the thermal reaction process.

The mixture of the passivation material 321 and the color material 331 is added to the high polymer material 4. The one-layer polymer structure and added material generate chemical reaction using the photo-curing process and the thermal reaction process. RGB color layer depends on the color material 331. Thus, the composite photoresist 31 having one-layer structure is obtained. The composite photoresist 31 is covered on the active switches 2, and the composite photoresist 31 is provided for two etching processes using the yellow light process. The passivation layer 32 or the color layer 33 is etched by reaction selectivity of etching solution, respectively, further forming the composite photoresist layer 3. The same time, the active switches 2 is effectively protected to avoid that the detergent directly etches the source electrodes 21 and the drain electrodes 22 of the active switches 2 of the display panel in the subsequent process, and protect the source electrodes 21 and the drain electrodes 22, further avoiding broken-line problem, decreasing scrap cost, and improving quality of the display panel.

Figure 12:
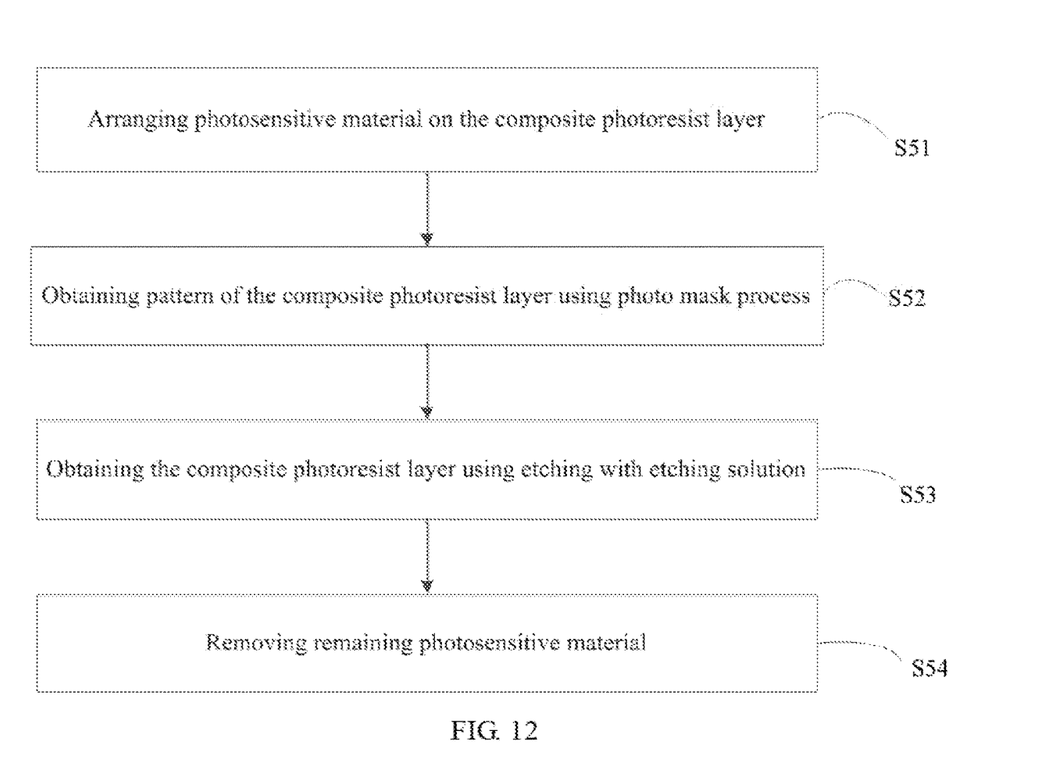
FIG. 12 is a flowchart of a method for manufacturing the display panel according to an embodiment of the present disclosure.

As shown in FIG. 12, the step for obtaining the composite photoresist layer covered on the active switches using a mask process comprises:
S51: arranging photosensitive material on the composite photoresist layer;
S52: obtaining pattern of the composite photoresist layer using a mask process;
S53: obtaining the composite photoresist layer using etching with an etching solution; and
S54: removing a remaining photosensitive material.

The photosensitive material is disposed on the composite photoresist 31, and the photosensitive material is subjected to exposure development by the mask process to obtain the pattern of the composite photoresist layer 3. The composite photoresist 31 is etched using the etching solution to obtain the composite photoresist layer 3, and residual composite photoresist on the composite photoresist layer 3 is removed using cleaning fluid to be convenient to operate in the subsequent process and operate other process on the composite photoresist layer 3, further conveniently manufacturing the display panel. The composite photoresist layer 3 is disposed, reduces steps of the process for manufacturing the display panel, conveniently manufactures the display panel, simplifies the process for manufacturing the display panel, reduces the production time of the display panel, and improves production efficiency of the display panel. The process for generating protective layer 6 using chemical vapor deposition (CVD) to sputter SiNx is removed, which reduces production cost of the display panel and improved market competitiveness of the display panel. In addition, the composite photoresist layer 3 has RGB color and replaces the color filter layer 5. The composite photoresist layer 3 is easy to use without using the CVD process/a etching process, only needs to simple yellow light process and replaces the protective layer 6 and RGB colored photoresist layer, which is easy to arrange the composite photoresist layer 3, simplifies the process for manufacturing the display panel and improves production efficiency of the display panel.

According to another aspect of the present disclosure, the present disclosure provides a display apparatus, where the display apparatus comprises the above display panel. Detail structure and connected relation of the display panel refer to FIG. 1 to FIG. 4, which is not detailed.

In the above embodiment, material of the substrate 1 can be glass and plastic, and so on.

In the above embodiment, the display panel comprises a liquid crystal display (LCD) panel and plasma panel. Take LCD panel as an example, the LCD panel comprises an array substrate and a color film substrate opposite to the array substrate. A liquid crystal and a photo spacer are positioned between the array substrate and the array substrate. A thin film transistor (TFT) is disposed on the array substrate and the color filter layer is disposed on the color filter substrate.

In the above embodiment, the color filter layer can comprise TFT array, the color filter and the TFT array can be formed on same substrate. The array substrate can comprise the color filter layer.

In the above embodiment, the display panel of the present disclosure can be a curved panel.

As the above, it should be understood that the present disclosure has been described with reference to certain preferred and alternative embodiments which are intended to be exemplary only and do not limit the full scope of the present disclosure as set forth in the appended claims.

The invention claimed is:

1. A display panel, comprising:
a substrate; and
active switches disposed on the substrate;
a composite photoresist layer having dielectric properties covering on the active switches; and
wherein the composite photoresist layer is made of composite photoresist; and the composite photoresist comprises at least one passivation layer and at least one color layer formed on a high polymer material.

2. The display panel according to claim 1, wherein the active switches comprise gate electrodes disposed on the substrate, a semiconductor layer disposed on the gate electrodes, and source electrodes and drain electrodes disposed on the semiconductor layer; the composite photoresist layer covers on the source electrodes and the drain electrodes.

3. The display panel according to claim 2, wherein the composite photoresist layer has an opening corresponding to the source electrodes and the drain electrodes.

4. The display panel according to claim 1, wherein the passivation layer and the color layer both have one layer, and the passivation layer and the color layer are stacked.

5. The display panel according to claim 4, wherein the active switches comprise gate electrodes disposed on the substrate, a semiconductor layer disposed on the gate electrodes, and source electrodes and drain electrodes disposed on the semiconductor layer; the composite photoresist layer covers on the source electrodes and the drain electrodes.

6. The display panel according to claim 5, wherein the composite photoresist layer has an opening corresponding to the source electrodes and the drain electrodes.

7. The display panel according to claim 1, wherein the passivation layer has two layers and the color layer has one layer, and the color layer is positioned between two passivation layers.

8. The display panel according to claim 7, wherein the active switches comprise gate electrodes disposed on the substrate, a semiconductor layer disposed on the gate electrodes, and source electrodes and drain electrodes disposed on the semiconductor layer; the composite photoresist layer covers on the source electrodes and the drain electrodes.

9. The display panel apparatus according to claim 8, wherein the composite photoresist layer has an opening corresponding to the source electrodes and the drain electrodes.

10. A method for manufacturing a display panel comprising a substrate and active switches disposed on the substrate, wherein the method comprises:
covering composite photoresist on the active switches; and
obtaining a composite photoresist layer covering on the active switches using a mask process; wherein the composite photoresist layer is made of composite photoresist; and the composite photoresist comprises at least one passivation layer and at least one color layer formed on a high polymer material.

11. The method for manufacturing the display panel according to claim 10, wherein the composite photoresist comprises a passivation layer and a color layer, the step for obtaining the composite photoresist comprises:
adding passivation material to a lower layer of high polymer material;
adding color material to an upper layer of the high polymer material; and
obtaining the composite photoresist having double-layer structure using a photo-curing process and a thermal reaction process.

12. The method for manufacturing the display panel according to claim 10, wherein the passivation layer has two layers and the color layer has one layer, the step for obtaining the composite photoresist comprises:
adding passivation material to a lower layer of high polymer material;
adding color material to a middle layer of the high polymer material;
adding the passivation material to an upper layer of the high polymer material; and
obtaining the composite photoresist having three-layers structure using a photo-curing process and a thermal reaction process.

13. The method for manufacturing the display panel according to claim 10, wherein the step for obtaining the composite photoresist comprises:

adding mixture of passivation material and color material to high polymer material; and obtaining the composite photoresist having one-layer structure using a photo-curing process and a thermal reaction process.

14. The method for manufacturing the display panel according to claim 10, wherein the step for obtaining the composite photoresist covered on the active switches using a mask process comprises:

arranging photosensitive material on the composite photoresist layer;

obtaining pattern of the composite photoresist layer using a mask process;

obtaining the composite photoresist layer using etching with an etching solution; and removing a remaining photosensitive material.

\* \* \* \* \*

UNITED STATES PATENT AND TRADEMARK OFFICE
CERTIFICATE OF CORRECTION

| | |
|---|---|
| PATENT NO. | : 10,725,357 B2 |
| APPLICATION NO. | : 15/744792 |
| DATED | : July 28, 2020 |
| INVENTOR(S) | : Chung-Kuang Chien |

Page 1 of 1

It is certified that error appears in the above-identified patent and that said Letters Patent is hereby corrected as shown below:

On the Title Page

Column 1, applicant field, insert the second applicant --CHONGQING HKC OPTOELECTRONICS TECHNOLOGY CO., LTD. CHONGQING (CN)--.

Signed and Sealed this
Third Day of August, 2021

Drew Hirshfeld
*Performing the Functions and Duties of the*
*Under Secretary of Commerce for Intellectual Property and*
*Director of the United States Patent and Trademark Office*